United States Patent [19]

Miyazaki

[11] 4,121,118
[45] Oct. 17, 1978

[54] BIPOLAR SIGNAL GENERATING APPARATUS

[75] Inventor: Seiichi Miyazaki, Wakou, Japan

[73] Assignee: Ohkura Electric Co., Ltd., Tokyo, Japan

[21] Appl. No.: 813,241

[22] Filed: Jul. 6, 1977

[30] Foreign Application Priority Data

Jul. 7, 1976 [JP] Japan .................. 51-90155

[51] Int. Cl.² ................ H03K 5/20; H03K 13/24
[52] U.S. Cl. .................... 307/262; 307/209; 307/236; 307/282
[58] Field of Search ........... 307/209, 236, 262, 216, 307/282

[56] References Cited

U.S. PATENT DOCUMENTS

| 2,700,696 | 1/1955 | Barker | 307/209 |
| 3,041,472 | 6/1962 | Ingman | 307/209 |
| 3,652,876 | 3/1972 | Baum et al. | 307/262 |
| 3,761,740 | 9/1973 | Naive | 307/236 X |

Primary Examiner—John S. Heyman
Attorney, Agent, or Firm—Sherman & Shalloway

[57] ABSTRACT

A bipolar signal generating apparatus for generating a bipolar signal having positive and negative polarities and comprising a switch means for connecting two terminals of a primary winding of a transformer with each other when the bipolar signal has a level of its neutral region.

4 Claims, 5 Drawing Figures

BIPOLAR SIGNAL GENERATING APPARATUS

BACKGROUND OF THE INVENTION

This invention relates to a bipolar signal generating apparatus having an ability of delivering a bipolar digital signal having positive and negative polarities to a transmission line.

A conventional signal generating apparatus adapted to gransfer a bipolar digital signal, which has widely been utilized in data transmission fields, to a transmission line is most generally composed of a converter circuit adapted to be supplied with two kinds of signals and a transformer having a primary winding connected to output terminals of the converter circuit and a secondary winding connected across a pair of lines for constituting a data transmission line, so-called data path. This converter circuit functions, when a first input signal has an "H" level, to cause a current to flow in one direction through the primary winding of the transformer and, when a second input signal has an "H" level, to cause a current to flow in a reverse direction through the primary winding of the transformer. As a result, in the secondary winding of the transformer is generated a bipolar signal having positive and negative levels. When both the two input signals have "L" levels, respectively, the primary winding is cut out of both an electric source and ground, so that an output level of the secondary winding is located at a neutral region. Since the primary winding of the transformer has a high impedance when it is cut out of both the electric source and ground, the output signal delivered from the secondary winding of the transformer has not a correct rectangular wave form.

SUMMARY OF THE INVENTION

An object of the invention is to provide a bipolar signal generating apparatus which can generate a bipolar signal having a correct rectangular wave form.

Another object of the invention is to provide a bipolar signal generating apparatus which can generate a bipolar signal and in which substantially no current flows at a period of time at which the bipolar signal has a level of its neutral region, whereby eliminating useless consumption of the electric power.

DESCRIPTION OF THE PREFERRED EMBODIMENTS

Figure 1:
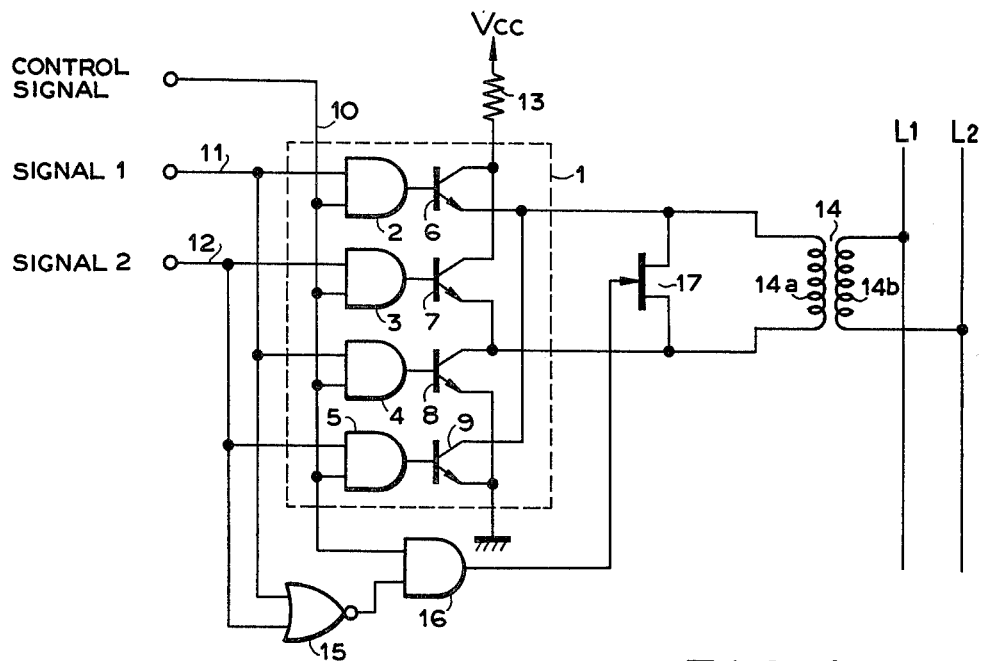
FIG. 1 is a circuit diagram of one embodiment of a bipolar signal generating apparatus according to the invention.

Referring to FIG. 1, reference numeral 1 designates a converter circuit which is composed of four AND gates 2, 3, 4 and 5, and four transistors 6, 7, 8 and 9. One of input terminals of all of the AND gates 2 to 5 is connected in common to a control signal supply line 10. The other input terminals of the AND gates 2 and 4 are connected to a line 11 and the other input terminals of the AND gates 3 and 5 are connected to a line 12. Output terminals of the AND gates 2 to 5 are connected to respective bases of the transistors 6 to 9.

Collectors of the transistors 6 and 7 are connected through a resistor $R_1$ to a direct current source Vcc. Emitters of the transistors 8 and 9 are connected to ground. An emitter of the transistor 6 and a collector of the transistor 9 are connected to one terminal of a primary winding 14a of a transformer 14 and an emitter of the transistor 7 and a collector of the transistor 8 are connected to the other terminal of the primary winding 14a.

To the lines 11 and 12 are connected two input terminals of a NOR gate 15 shose output terminal is connected to one of two input terminals of an AND gate 16 whose another input terminal is connected to the line 10. That is, the AND gate 16 functions to generate an output signal having an "H" level when a level of the control signal and a level of an output signal of the NOR gate 15 are "H". The output signal of the AND gate 16 is supplied to a gate of a FET 17 constituting an analog switch adapted to operate in response to the output level of the AND gate 16. A source and drain of the FET 17 are connected across the terminals of the primary winding 14a of the transformer 14. The FET 17 is one example of the analog switch and may be replaced by any other forms of analog switches, for example, a diode bridge, two transistors connected in cascade and the like.

Two terminals of a secondary winding 14b of the transformer 14 are connected to a pair of lines $L_1$ and $L_2$ for constituting a data transmission line, respectively. To the lines $L_1$ and $L_2$ may be connected a plurality of bipolar signal generating apparatuses which are the same in construction as that shown in FIG. 1.

The bipolar signal generating apparatus shown in FIG. 1 becomes operated in response to a control signal supplied from the line 10, a signal 1 supplied from the line 11 and a signal 2 supplied from the line 12.

Figure 2:
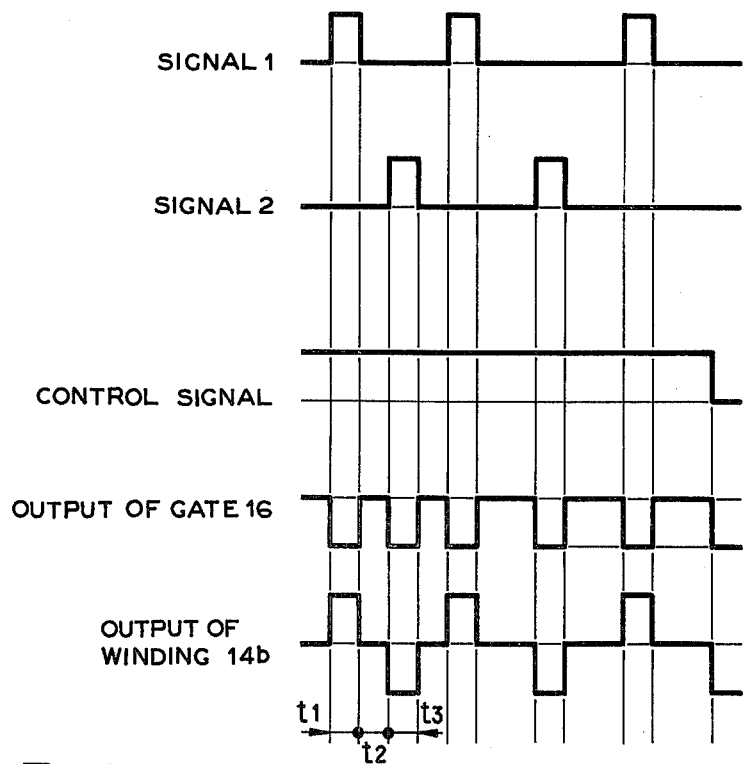
FIG. 2 is a graph illustrating one example of wave forms of a signal 1, a signal 2 and a control signal supplied to the apparatus shown in FIG. 1 and wave forms of output signals delivered from a gate and a secondary winding of a transformer when the signals 1, 2 and the control signal are supplied to the apparatus.

As shown in FIG. 2, the signals 1 and 2 are digital signals having two values composed of "H" level and "L" level, no "H" levels of both the signals 1 and 2 being simultaneously produced. The signals 1 and 2 are supplied from a data treating device not shown which also generates a control signal having the "H" level at a period of time at which the signals 1 and 2 are delivered as a data from the data treating device.

At a period of time $t_1$ shown in FIG. 2, both the signal 1 and the control signal have the "H" level, respectively, so that the level at the output terminals of the AND gates 2 and 4 becomes "H". As a result, the transistors 6 and 8 become ON. In addition, "H" level of the signal 1 is reversed to "L" level at the NOR gate 15, so that the output level of the AND gate 16 becomes "L" and hence the FET 17 becomes OFF. Under such condition, a current supplied from a direct curret source Vcc through the resistor $R_1$ flows through a collector-emitter junction of the transistor 6, primary winding 14a of the transformer 14 and collector-emitter junction of the transistor 8 to ground. The current flowing through the primary winding 14a causes the secondary winding 14b to generate a current which is delivered through the lines $L_1$ and $L_2$ as a positive output.

At the end of the period of time $t_1$, the level of the signal 1 is changed from "H" to "L" and hence the output levels of the AND gates 2 and 4 become "L". As a result, the transistors 6 and 8 become OFF. At the same time, the output level of the NOR gate 15 becomes "H" and the output level of the AND gate 16 becomes "H". Thus, the FET 17 becomes ON to shortcircuit between the two terminals of the primary winding 14a. This condition is maintained for a period of time $t_2$ at which both the signals 1 and 2 have "L" level, respectively. Within this period of time $t_2$, the output of the secondary winding 14b of the transformer 14 has a level of its neutral region.

At a period of time $t_3$, the level of the signal 2 becomes "H", so that the transistors 7 and 9 become ON. At the same time, the FET 17 becomes OFF. Under such condition, the current supplied from the direct current source Vcc through the resistor $R_1$ flows through a collector-emitter junction of the transistor 7, primary winding 14a and collector-emitter junction of the transistor 9 to ground. In this case, the current flowing through the primary winding 14a is opposite in direction to that which flows through the primary winding 14a when the signal 1 has "H" level. As a result, there is appeared a negative output at the secondary winding 14b. This condition is maintained until the period of time $t_3$ is terminated at which the level of the signal 2 is changed into "L" to make the FET 17 ON.

As described above, at the period of time at which both the signals 1 and 2 have "L" level, respectively, that is, the output of the secondary winding 14b is a level of its neutral region, the two terminals of the primary winding 14a are shortcircuited through the FET 17, so that the impedance of the primary winding 14a becomes extremely low. As a result, the wave form of the output signal is significatly improved if compared with that of the conventional bipolar signal generating apparatus including a transformer whose primary winding has a high impedance at the period of time at which the output of the secondary winding has a level of its neutral region.

Figure 3:
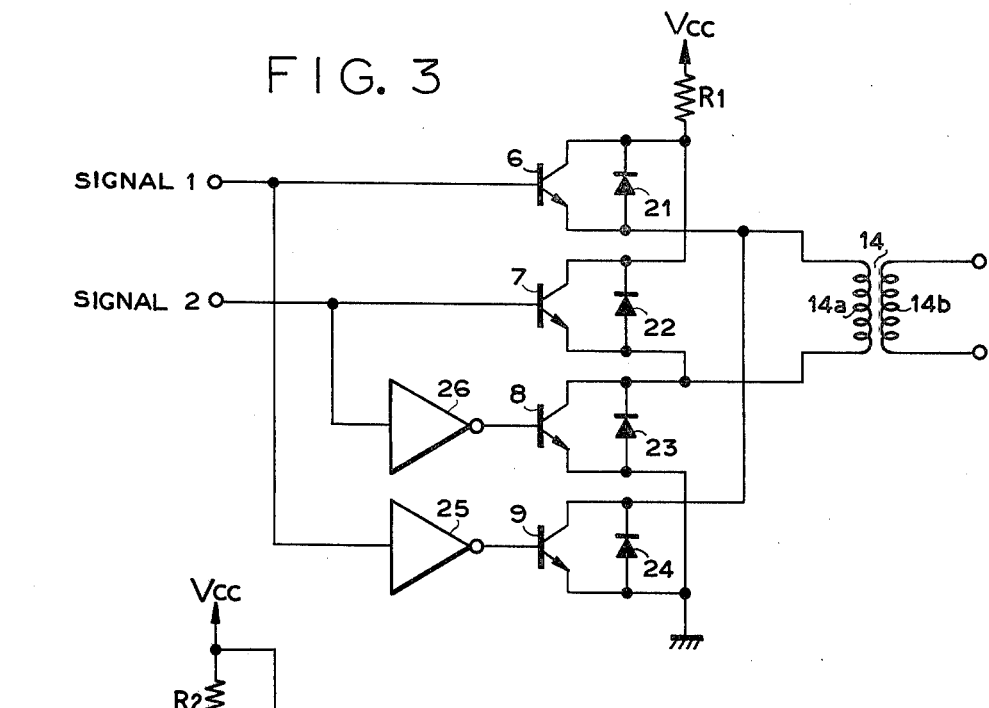
FIG. 3 is a circuit diagram of another embodiment of a bipolar signal generating apparatus according to the invention.

In FIG. 3 is shown another embodiment of the apparatus according to the invention. In the present embodiment, the collectors and emitters of the transistors 6 to 9 are connected to the electric source or ground in the same relation as those of the embodiment shown in FIG. 1. That is, one of the terminals of the primary winding 14a of the transformer 14 is connected to a junction point between the emitter of the transistor 6 and the collector of the transistor 9 and the other terminal is connected to a junction point between the emitter of the transistor 7 and the collector of the transistor 8. In the present embodiment, between the emitters and the collectors of the transistor 6 to 9 are connected diodes 21, 22, 23 and 24 with each anode of which connected to the emitter side, respectively.

The signal 1 supplied from the data treating device not shown is directly supplied to the base of the transistor 6 and supplied through an inverter 25 to the base of the transistor 9. Similarly, the signal 2 is directly supplied to the base of the transistor 7 and supplied through an inverter 26 to the base of the transistor 8. As a result, if the level of the signal 1 is changed from "H" to "L" and vice versa, the conditions of the transistors 6 and 9 become opposite from each other. This relation is also held between the transistors 7 and 8.

If the level of the signal 1 is "H", the transistor 6 becomes ON and the transistor 9 becomes OFF. At this period of time, the signal 2 is always held at "L" level, so that the transistor 7 becomes OFF and the transistor 8 becomes ON. The current supplied from the electric source Vcc through the resistor $R_1$ flows through the transistor 6 which is held at its ON condition, primary winding 14a and the transistor 8 to ground. At the period of time at which, the level of the signal 2 is "H", both the transistors 7 and 9 become ON, so that the current flows through the primary winding 14a in a direction which is opposite to the above described direction. As a result, in the same manner as in the case of the circuit shown in FIG. 1, the secondary winding 14b functions to deliver the bipolar signal. At the period of time at which the levels of both the signals 1 and 2 are "L", both the transistors 8 and 9 become ON, and as a result, the two terminals of the primary winding 14a of the transformer 14 are shortcircuited through these transistors 8 and 9. The diodes 21 to 24 connected across the collectors and emitters of the transistors 6 to 9, respectively, function to prevent the reverse voltage from being subjected between the collectors and the emitters of these transformers 6 to 9.

In the same manner as the embodiment shown in FIG. 1, in the embodiment shown in FIG. 3, at the period of time at which the levels of both the signals 1 and 2 are "L", the impedance of the primary winding 14a of the transformer 14 becomes extremely low, so that it is possible to improve the wave form of the output signal delivered from the secondary winding 14b.

Figure 4:
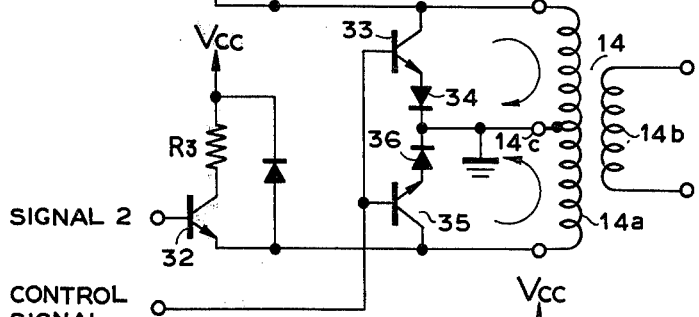
FIG. 4 is a circuit diagram of a further embodiment of a bipolar signal generating apparatus according to the invention.

In FIG. 4 is shown a further embodiment of the apparatus according to the invention. In the present embodiment, use is made of a transformer 14 including a primary winding 14a having an intermediate tap 14c connected to ground. A transistor 31 becomes ON when the signal 1 supplied to its base has the "H" level. At this time, the current supplied from the direct current source Vcc through a resistor $R_2$ flows through a collection-emitter junction of the transistor 31 and the intermediate tap 14c of the primary winding 14a to ground. At a period of time at which the signal 2 has the "H" level, a transistor 32 permits a current supplied from the direct current source Vcc through a resistor $R_3$ to flow from the other terminal of the primary winding 14a to ground. The above mentioned two kinds of direct currents flow the primary winding 14a in direction opposite with each other, thereby generating the bipolar signal at the secondary winding 14b.

One of the terminal of the primary winding 14a is connected through a collector-emitter junction and a diode 34 to ground and the other terminal of the primary winding 14a is connected through a collector-emitter junction of a transistor 35 and a diode 36 to ground. These transistors 33 and 35 become ON when the control signal supplied from the signal treating circuit not shown becomes "H" level to simultaneously connect both the two terminals of the primary winding 14a to ground. In the present embodiment, the control signal has "H" level only at a period of time at which both the signals 1 and 2 have "L" levels, respectively.

Figure 5:
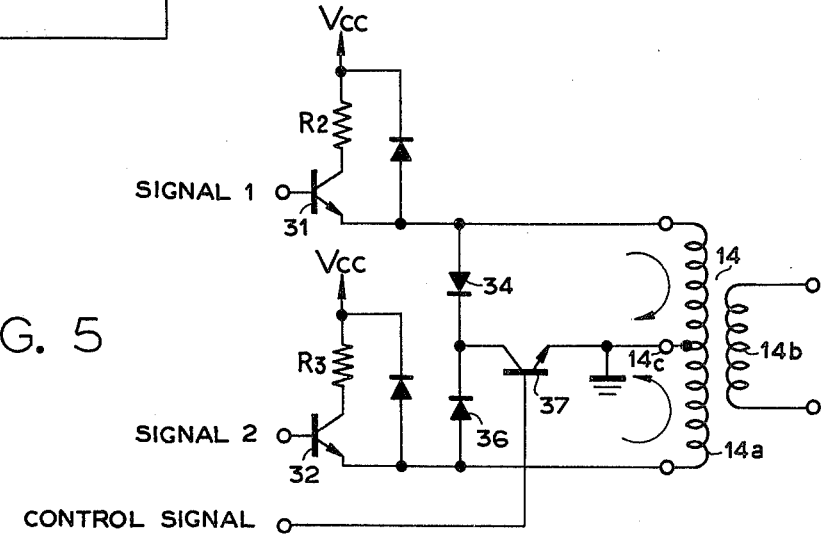
FIG. 5 is a circuit diagram of a still further embodiment of a bipolar signal generating apparatus according to the invention.

In FIG. 5 is shown a still further embodiment of the apparatus according to the invention. In the present embodiment, the transistors 33 and 35 shown in FIG. 4 are omitted and use is made of a transistor 37 having a collector connected to a junction point between the diodes 34 and 36 and an emitter connected to ground. To a base of the transistor 37 is supplied the control signal which is the same as that supplied to the bases of the transistors 33 and 35 shown in FIG. 4. As a result, the transistor 37 functions to connect both the two terminals of the primary coil 14a to ground when the control signal has the "H" level.

In the embodiments shown in FIGS. 4 and 5, each of the transistors 33, 35 and 37 may be replaced by any other switch element which is electronically operative.

As stated hereinbefore, in the bipolar signal generating apparatus according to the invention, when both the signals 1 and 2 have the "L" levels, respectively, that is, when the output signal from the secondary winding 14b has a level of its neutral region, the two terminals of the primary winding 14a are kept at the same potential. This means that the impedance of the primary winding 14a is extremely small and that the wave form of the output signal from the secondary winding 14b is of excellent one which is similar to a correct rectangular wave form. In addition, under such condition, no current flows through the primary winding 14a, thereby providing the important advantage that unnecessary current is not consumed.

What is claimed is:

1. In an apparatus for generating a bipolar signal from two kinds of signals which are related such that at a period of time at which one of said two signals has an "H" level the other signal has an "L" level, said bipolar signal having a positive level at a period of time at which said first signal has said "H" level having a negative level at a period of time at which said second signal has said "H" level and having a level of its neutral region at a period of time at which both said first and second signals have said "L" levels, respectively, the improvement comprising a transformer having a primary winding and a secondary winding, a first switch means for supplying a current to said primary winding flowing therethrough in one direction when said first signal has said "H" level, a second switch means for supplying a current to said primary winding flowing therethrough in a direction opposite to said direction and a third switch means for connecting two terminals of said primary winding with each other when both said first and second signals have said "L" levels, respectively.

2. The apparatus according to claim 1 wherein said third switch means is an analog switch.

3. The apparatus according to claim 1 wherein said first switch means is composed of a first transistor for connecting a direct current source to a first terminal of said primary winding when said first signal has said "H" level and a second transistor for connecting a second terminal of said primary winding to ground when said first signal has said "H" level, and said second switch means is composed of a third transistor for connecting said direct current source to said second terminal of said primary winding when said second signal has said "H" level and a fourth transistor for connecting said first terminal of said primary winding to ground when said second signal has said "H" level.

4. The apparatus according to claim 1 wherein said primary winding of said transformer is provided with an intermediate tap and said third switch means is connected between said two terminals of said primary winding and ground.

* * * * *